(12) United States Patent
Almes et al.

(10) Patent No.: US 7,185,310 B2
(45) Date of Patent: Feb. 27, 2007

(54) SYSTEM AND METHOD FOR CHARGE-BALANCED, CONTINUOUS-WRITE MASK AND WAFER PROCESS FOR IMPROVED COLINEARITY

(75) Inventors: Robin Lynn Almes, Sunnyvale, CA (US); Mark Anthony Church, Los Gatos, CA (US); Mary Kathyrn Gutberlet, Prunedale, CA (US); Jiunn Tsay, San Jose, CA (US); Benjamin Lu Chen Wang, San Jose, CA (US)

(73) Assignee: Hitachi Global Storage Technologies, Amsterdam (NL)

( * ) Notice: Subject to any disclaimer, the term of this patent is extended or adjusted under 35 U.S.C. 154(b) by 434 days.

(21) Appl. No.: 10/823,981

(22) Filed: Apr. 14, 2004

(65) Prior Publication Data
US 2005/0235231 A1   Oct. 20, 2005

(51) Int. Cl.
*G06F 17/50*   (2006.01)
(52) U.S. Cl. .......................... 716/19; 716/21
(58) Field of Classification Search .............. 430/5; 716/19–21
See application file for complete search history.

(56) References Cited

U.S. PATENT DOCUMENTS

| | | | |
|---|---|---|---|
| 5,272,501 A * | 12/1993 | Nishi et al. ................ 355/53 |
| 2004/0166419 A1 * | 8/2004 | Lee ........................ 430/5 |
| 2005/0104013 A1 * | 5/2005 | Stengl et al. ........ 250/492.21 |
| 2005/0130045 A1 * | 6/2005 | Ozawa ..................... 430/5 |
| 2005/0170655 A1 * | 8/2005 | Bencher et al. .......... 438/700 |
| 2005/0198602 A1 * | 9/2005 | Brankner .................... 716/8 |
| 2005/0219767 A1 * | 10/2005 | Nakamura et al. ...... 360/324.1 |

* cited by examiner

*Primary Examiner*—Paul Dinh
*Assistant Examiner*—Suchin Parihar
(74) *Attorney, Agent, or Firm*—Bracewell & Giuliani LLP

(57) ABSTRACT

A charge-balanced, continuous-write mask and wafer process changes the magneto resistive photo-definition step to a two-mask step operation. Critical images are written on one mask layer at a very small electron beam spot size, and non-critical images are written on a second mask layer at a relatively larger electron beam spot size. Both mask layers are put onto the same glass substrate where the critical mask layer is located at the most accurate position on the substrate. The non-critical images may be placed in a peripheral field. In wafer processing, the critical field is aligned and exposed onto the wafer and then the non-critical field is aligned and exposed.

25 Claims, 4 Drawing Sheets

SYSTEM AND METHOD FOR CHARGE-BALANCED, CONTINUOUS-WRITE MASK AND WAFER PROCESS FOR IMPROVED COLINEARITY

BACKGROUND OF THE INVENTION

1. Technical Field

The present invention relates in general to an improved write mask and wafer process and, in particular, to an improved system and method for a charge-balanced, continuous-write mask and wafer process.

2. Description of the Related Art

Glass masks are used in magneto resistive (MR) thin film head wafer processes. Electron beam (E-beam) or laser photo-resist imaging tools are used in the production of such glass masks. Specific mask layers typically have critical overlay and image size tolerances. The critical masks used for the MR stripe layer have an additional requirement known as colinearity error, which is defined as the y-axis deviation of the back edge of a row of MR stripes from a straight line. The colinearity quality is important because it directly relates to a key magnetic performance parameter known as MR stripe height.

Historically, glass masks made by E-beam and laser mask tools had such high quality that they were an insignificant contributor to the overall control of stripe height. However, as aerial densities in disk drives increase, the need for narrower track widths and shorter stripe heights requiring tighter controls have made mask colinearity a significant detractor in achieving satisfactory stripe height requirements.

The problems associated with improving colinearity include a number of errors associated with the control of image size, image placement, and image edge fidelity, namely:

1. Positional error of the stage mechanics relative to a Cartesian grid contributes to image placement error;
2. Glass expansion during the time that it takes to write a row of stripe images contributes to image placement error;
3. Variation in the electron charging of the photo-resist can unevenly deflect the E-beam during the writing of critical edges, thereby contributing to image placement error;
4. Fracturing design data to cause critical images to be split in two and written at different times causes steps along the critical edge;
5. Image error by stray E-beams during the writing of adjacent non-critical images or structures can affect the exposure of critical images resulting in a variation in optimum development time from image to image, thereby increasing colinearity error; and
6. Where it would be desirable to write at very small spot sizes for highest resolution and accuracy, it is not practical to do so because of long write time.

All of these problems contribute to error in image placement, image size, or image edge fidelity, which in turn increases colinearity error. The following disclosure of the present invention describes an improved E-mask making method and wafer process whereby errors generated by these problems are minimized. While laser equipment is a more state of art tool than E-beam tools, E-beam generated masks that use the present invention outperform such laser equipment. However, laser-generated masks may show superior colinearity results if continuous write methods were employed.

SUMMARY OF THE INVENTION

One embodiment of a system and method for a charge-balanced, continuous-write mask and wafer process is disclosed. One component of the present invention is to change the MR photo-definition step to a two-mask step operation. Critical images are written on one mask layer at a very small E-beam spot size, and non-critical images are written on a second mask layer at a much larger E-beam spot size. In one embodiment, both mask layers are put onto the same glass substrate where the critical mask layer is located on the "center field" of the glass (i.e., the most accurate position). The non-critical images may be placed in a peripheral field. In wafer processing, the critical field is aligned and exposed onto the wafer and then the non-critical field is aligned and exposed.

By separating the critical and non-critical mask layers, steps can be taken to optimize each layer: one for colinearity and the other to minimize write time. Critical colinearity features are written at a very small spot size to maximize resolution and image edge fidelity. Non-critical mask features are written at large spot size to minimize write time. Total write time can be less than a single mask layer with a compromised spot size.

By separating critical and non-critical mask features into two mask layers, the critical colinearity features have such significant distance from each other that the stray electron beam problem is eliminated. In addition, with the separation of critical and non-critical mask features and the use of a reverse image design scheme that defines the upper and lower stripe edges in a negative mask format, an entire set of critical features can be written in less than an hour instead of many hours. This is a first step toward reducing error due to glass expansion or shrinkage, and control of stray E-beam problems, which will substantially improve colinearity.

Next, by separating critical and non-critical mask features and using a reverse image design scheme, glass expansion error can be effectively eliminated by writing each row continuously starting with the MR stripe in the first column to the MR stripe in the last column of each row. This system writes each row in less than two minutes to further reduce the errors related to glass expansion or shrinkage.

Furthermore, by separating critical and non-critical mask features and using the reverse image design scheme with continuous write, other mechanical effects associated with long y-axis stage moves are eliminated and data can be organized to write in unfractured images. Eliminating long stage moves reduces image placement error that further reduces colinearity error. Writing unfractured images eliminates the tools' minimum data segment boundary problem and achieves a more accurate position of critical features through improved mask registration.

Moreover, by separating critical and non-critical mask features, using the reverse image design scheme with continuous write, and adding additional charge-balancing features, colinearity error associated with unbalanced photo-resist charging is eliminated. These charge-balancing features, written before the critical features are written, purposely add equal electron charge above and below the critical images to prevent electron beam deflection by unequal electron charge that would otherwise exist.

The foregoing and other objects and advantages of the present invention will be apparent to those skilled in the art, in view of the following detailed description of the present invention, taken in conjunction with the appended claims and the accompanying drawings.

BRIEF DESCRIPTION OF THE DRAWINGS

So that the manner in which the features and advantages of the invention, as well as others which will become apparent are attained and can be understood in more detail, more particular description of the invention briefly summarized above may be had by reference to the embodiment thereof which is illustrated in the appended drawings, which drawings form a part of this specification. It is to be noted, however, that the drawings illustrate only an embodiment of the invention and therefore are not to be considered limiting of its scope as the invention may admit to other equally effective embodiments.

DETAILED DESCRIPTION OF THE INVENTION

Referring to FIGS. 1–10, one embodiment of a system and method for a charge-balanced, continuous write mask and wafer process is shown. The first step is to write "charge-balancing" features 21, 23 in order to build a critical negative image magneto resistive (MR) stripe defining field. In this disclosure, although a single mask background and foreground is preferred, a double mask may be used. The system of the present invention has several fields, including foreground in one, test sites in continuous write mode in another, background non-critical targets in another, critical targets in another, etc.

In the prior art, design systems required designers to design in correct positive, correct negative, reverse positive, reverse negative format considering the use of negative or positive photo-resist. Thereafter the post-processing programs are given instructions to write as correct positive, correct negative, reverse positive, and reverse negative depending on what is wanted on the finished plate when using positive or negative photo-resist. Today, the so-called "negative format" may be designed in using the positive working design programs. This is done by forcing the result of new design systems by designing the feature and giving post-processing instructions in such a way that the results are in the negative format. As described in the conventional manner, the critical images are defined to be the stripe-defining critical features above and below the stripe. E-beam resist is negative working resist, so the mask must be designated as negative. The chromium image is on the bottom of the plate as it was designed, so the plate must be reverse image and must be designated.

Figure 1:
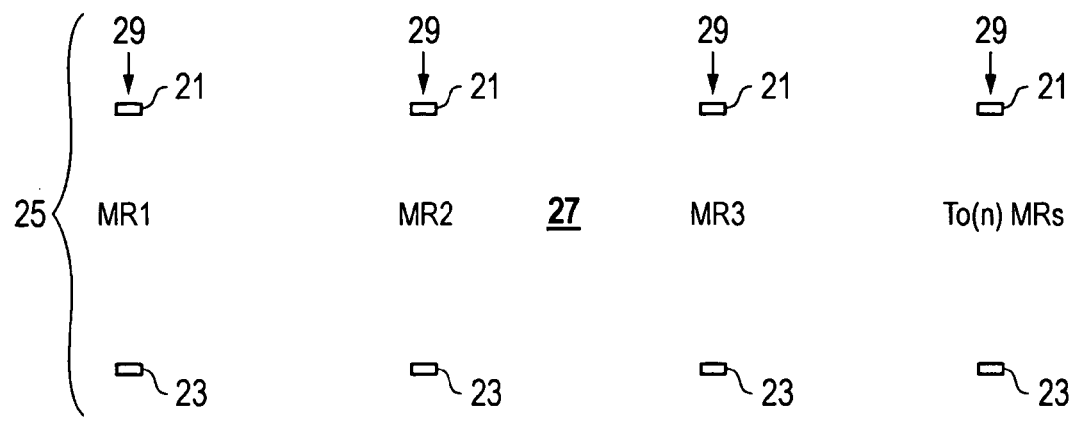
FIG. 1 is a schematic plan view of one embodiment of a wafer row at an initial charge balancing phase and is constructed in accordance with the present invention.
Figure 2:
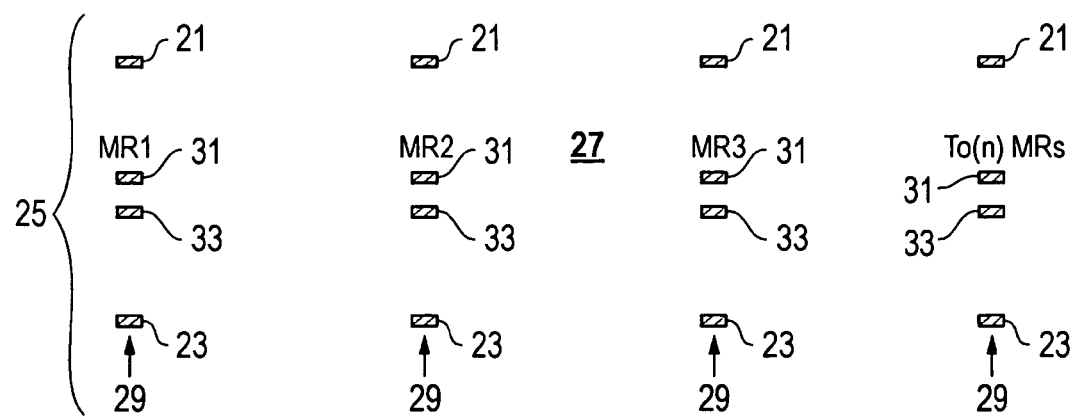
FIG. 2 is a schematic plan view of the wafer row of FIG. 1 showing MR stripe defining features and is constructed in accordance with the present invention.

FIG. 1 shows one embodiment of charge-balancing features 21, 23 for a single row 25 (e.g., "horizontal" row) on a mask of a wafer 27. The row 25 has a number of MR devices 29 (appearing "vertically") labeled 1 to (n) (i.e., MR(n)), that are repeated for as many rows 25 as are defined on the layout of the wafer 27. The charge-balance features 21, 23 are designed in equal-sized pairs, one above and one below each MR device 29. The charge-balance features 21, 23 are in close proximity to the area where the eventual MR stripe defining features will be written in subsequent process steps. Since the charge-balance features 21, 23 are equal in size the resist charging is also equal. It is recommended that the center of the glass plate used in the process be allocated for this field because it is generally more accurate than those portions that are close to the edges of the mask. For efficiency considerations, the non-critical features can be written at a larger spot size since they are not critical in image size variation or position. Using one plate is preferred and the most accurate, but two plates may be used if, for example, arrays are so large that they could not be put on one plate.

In the next step (FIG. 2), the critical upper edge and lower edge MR stripe defining features 31, 33 are written between matched ones of the charge-balancing features 21, 23. Features 31, 33 are written in a "continuous write" mode, meaning that they are written pair-by-pair, unfractured, and in-line along each row 25 of MR devices 29. By having the charge-balance features 21, 23 with equal charges created by equal size and approximately equal distance from the MR stripe defining features 31, 33, the electromagnetic forces acting on the E-beam while writing the MR stripe defining features 31, 33 will be equal and, thus, significantly reduce or eliminate any E-beam deflection by external motive charging.

In addition, by writing only the small critical features in a negative mask format, the high charge concentrations typically associated with writing positive masks are eliminated. Such high charge concentrations are known to cause E-beam deflection. By organizing design data and forcing the E-beam tool to write continuously across each row 25, the features 31, 33 are unfractured, the write time is less than one minute per row 25, and y-axis stage corrections are within a few nanometers, all of which further improves colinearity. Alignment marks, test structures, and other features not shown are constructed in the same manner by having charge-balance features above and below as previously described. Alternatively, charge-balancing features may be positioned to each lateral side of the image defining features when "horizontal" charge-balancing is desired. This step completes the critical feature field of the MR stripe defining field, which is also known as the foreground exposure field (see FIG. 5).

Figure 3:
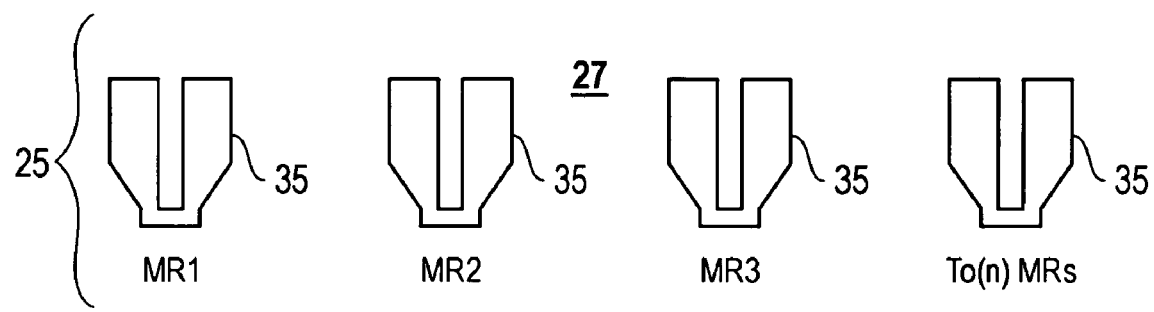
FIG. 3 is a schematic plan view of the wafer row of FIG. 1 showing less critical features and is constructed in accordance with the present invention.
Figure 4:
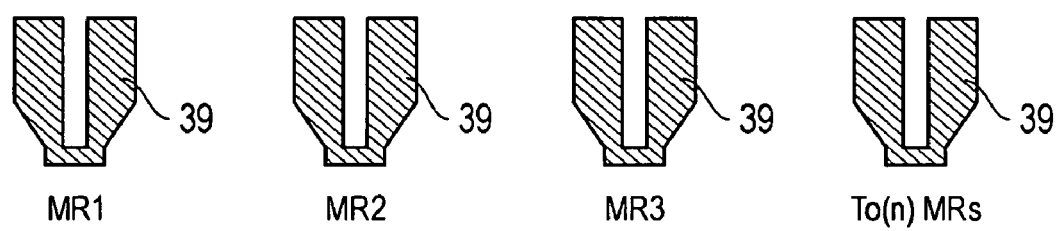
FIG. 4 is a schematic plan view of the wafer row of FIG. 1 showing a background field with non-critical features and is constructed in accordance with the present invention.

Referring now to FIG. 3, the next step is to write the second field in the peripheral area of the plate and mask. This mask field contains all of the non-critical features 35 of the wafer 27 and is typically called the background field (see FIG. 4). The non-critical features 35 may be written as positive working images at a relatively larger spot size (with respect to the critical images) in order to reduce write time. Additionally, because the second field comprises all non-critical features 35, it can be written in the most efficient way, ignoring fracturing and non-continuous writing. FIG. 3 shows a simplified view of one row 25 of these less-critical structures, MR(n), which are repeated for as many rows as are defined by the wafer layout. After this step, the writing of the continuous write charge-balanced mask is complete. After subsequent steps such as develop, etch, resist stripe, metrology, and cleaning, the mask is ready for dual-exposure wafer processing.

Figure 5:
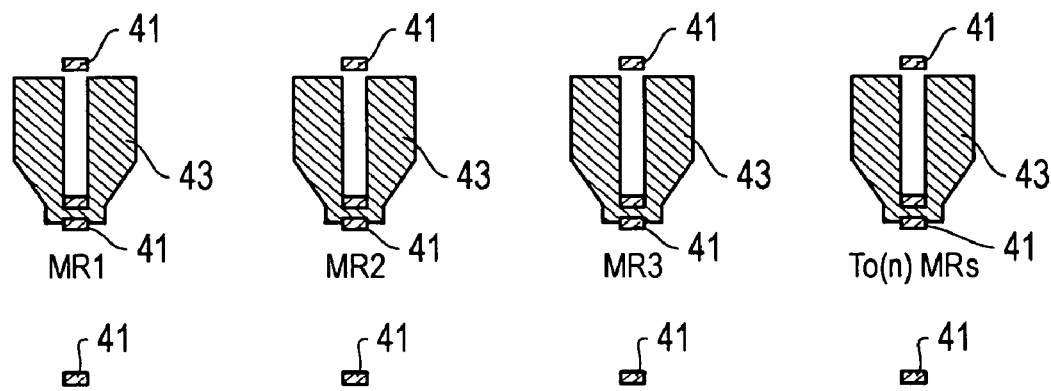
FIG. 5 is a schematic plan view of the wafer row of FIG. 1 showing a foreground field with critical features and is constructed in accordance with the present invention.
Figure 6:
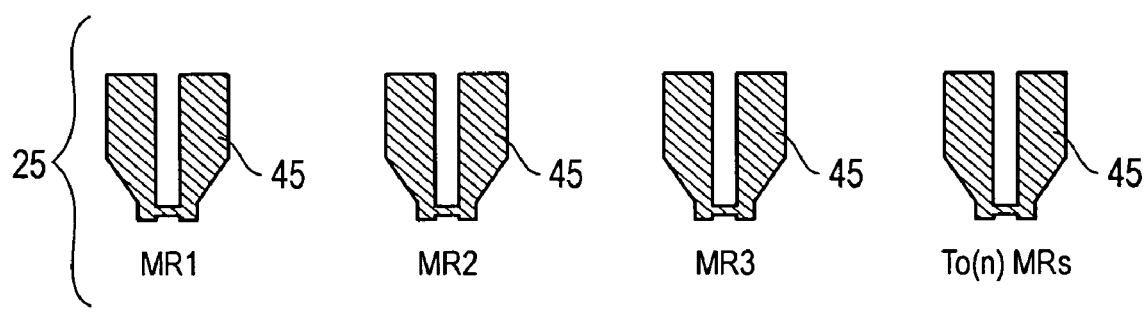
FIG. 6 is a schematic plan view of the wafer row of FIG. 1 showing resulting photo-resist images constructed in accordance with the present invention.
Figure 7:
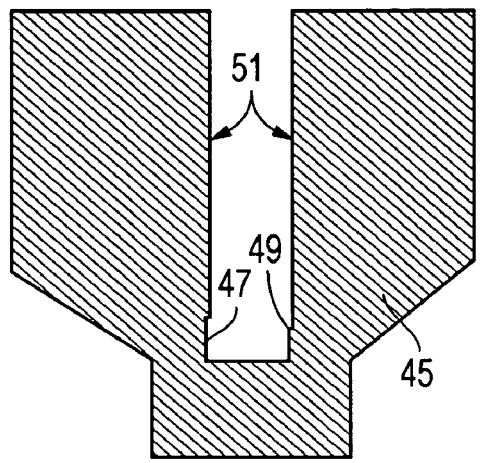
FIG. 7 is a schematic plan view of a wafer row image of FIG. 1 illustrating imperfections in the image.

During wafer exposure, the foreground masking step (see FIG. 5) overlays and overlaps the background masking step (see FIG. 4) in such a way as to produce a final resist image 45 (see FIG. 6). The process by which the overlay and overlap of the background to foreground proceeds to achieve this resist image at wafer exposure is best explained by stepping through the wafer process and exposures for a single row of MR(n) devices.

In another step (FIG. 4), photo-resist 39 is selected and applied (assumed to be positive working) for use as the eventual ion milling mask, followed by post-baking in a conventional manner. In one embodiment of the process, the foreground field (FIG. 5) is exposed first. However, the process with illustration is much easier to explain by describing a process where the background field (FIG. 4) is exposed first. Hence, next step is to expose the negative working foreground field using the same energy and time as the background field.

FIG. 5 shows the resulting photo-resist pattern of the foreground 41 (double-crosshatched) and unexposed photo-resist of the background 43 (single-crosshatched). The next step is to expose the negative working foreground field 41 using the same energy and time as the background field 43. The positive background field 43 exposes almost all of the background resist on the water except the single-crosshatched area. The foreground field 41 is a negative mask and only exposes the double-crosshatched area. Therefore, the lead portion of the MR layer (single-crosshatched) is defined by the background 43, and the critical upper and lower edges of the eventual MR stripe are defined by the critical foreground stripe defining features 41 (double-crosshatched). The charge-balancing features 21, 23 are not exposed into resist by the foreground 41 because the background field 43 has already exposed the resist.

FIG. 6 shows the resulting photo-resist images 45 of this single row 25 of MR devices after the water has been developed. With this two mask system, the foreground 41 and background 43 may not be in perfect alignment or exposure (see FIG. 7). As a result, notches 47 and protrusions 49 in the sidewall(s) 51 of the lead 45 may form. These formations are the result of the foreground being misaligned (to the left, in the case shown), which produces the deviations 47, 49 in the sidewalls 51 of the background exposure.

Figure 8:
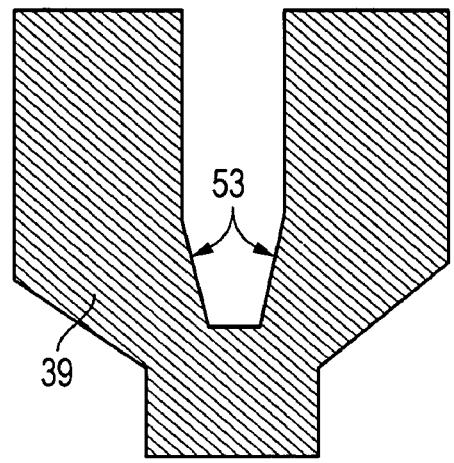
FIG. 8 is an enlarged plan view of one image on the wafer row of FIG. 1 showing an alternate embodiment constructed in accordance with the present invention.
Figure 9:
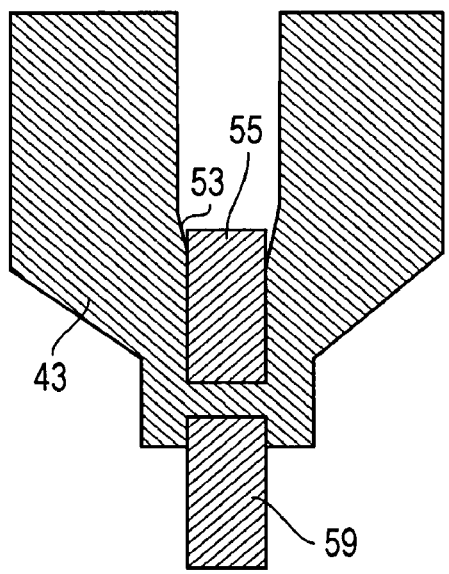
FIG. 9 is an enlarged plan view of the image of FIG. 8 during foreground exposure and is constructed in accordance with the present invention.
Figure 10:
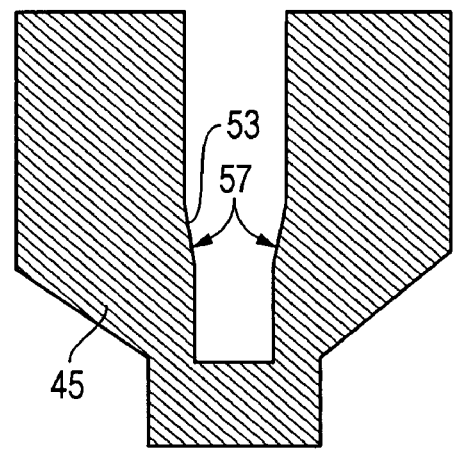
FIG. 10 is an enlarged plan view of the image of FIG. 8 showing a post-development result and is constructed in accordance with the present invention.

Since notching/protrusion problems may cause film stresses, lift-off problems, and/or may be mistaken for defects at inspection, etc., it is best to eliminate them. This can be achieved by careful design selection wherever background foreground exists. As shown in FIGS. 8–10, one embodiment of a solution to this problem is to employ angles at interfaces where the background and foreground come together. In the version shown, angles 53 (FIG. 8) are added to the background exposure 39. The upper stripe defining feature 55 (FIG. 9) of foreground exposure is extended above the apex 57 of the background exposure. In addition, the lower stripe defining feature 59 of the foreground exposure is made equal in size of the upper feature 55 to balance the E-beam charge. The post-development result (FIG. 10) of misalignment would be only to move the apex 57 of the angles 53 up or down, depending on the direction of misalignment. The notches and protrusions 47, 49 (FIG. 7) are eliminated while movement of the apex 57 would have negligible effect on the MR device.

Once ion milling, planarizing backfill, lift-off, and any other required process step(s) are complete, the wafer is ready for lead deposition by some process, typically involving ion milling lift-off. Once leads are deposited, all other layers are deposited in a conventional manner to complete wafer fabrication.

The present invention was developed and first used for MR stripe height defining masks. However, it is not limited to that application, to the improvement of colinearity, or to use in thin film wafer processes. The present invention may be used for other applications as well, such as image size and placement control, read write offset, etc. The present invention also could be used for other wafer applications such as semiconductors.

In one embodiment, the present invention comprises a method of charge-balancing and continuously writing a wafer mask process. The method comprises providing a wafer with a plurality of rows, writing a foreground field with charge-balancing features as negative images on the wafer, row-by-row, to build critical features for a plurality of MR devices on each row to define an MR stripe field, writing additional critical features that define additional boundaries of the MR stripe fields between each of the charge-balancing features, and defining the additional critical features as upper and lower edges of the MR stripe fields, and writing a background field having non-critical features adjacent to each of the critical features.

The method may comprise writing a pair of charge-balancing features for each MR device, the pair being equal in size and equal in resist charge but spaced apart from each other, and placing the charge-balancing features in close proximity to an area where the MR stripe field is written. The method may comprise writing the additional critical features in a continuous write mode, pair-by-pair, unfractured, in-line along each row of, and equal distance from the MR devices, such that electromagnetic forces acting on a writing device that write the MR stripe fields is equal and, thus, significantly reduces any deflection of the writing device by external motive charging.

In addition, the method may comprise writing the non-critical features in a peripheral area of the background field as positive working images at a relatively larger spot size than the critical images in order to reduce write time. The method also may comprise ignoring fracturing and non-continuous writing.

Furthermore, the method may comprise overlaying and overlapping the background field with the foreground field, and/or exposing the foreground field before the background field, and exposing the foreground field using a same energy and time of exposure as the background field. The method may further comprise exposing the resist with the background field so that the charge-balancing features are not exposed into resist by the foreground field, and/or using angles at interfaces where the background and foreground fields intersect to reduce the formation of deviations, and adding the angles to the background field, and extending the foreground field above an apex of the background field.

The present invention has several advantages, including the ability to charge-balance and continuous-write mask and wafer processes. This two-mask operation writes critical images on one mask layer at a very small size, and non-critical images on a second mask layer at a relatively larger size. By separating the critical and non-critical mask layers, each layer is improved for colinearity and write time reduction, respectively. In addition, the critical colinearity features improve resolution and image edge fidelity. Moreover, stray electron beams, glass expansion errors, and other mechanical effects associated with long y-axis stage moves are eliminated. A byproduct is the elimination of minimum data segment boundaries and more accurate positioning of critical features through improved mask registration. Furthermore, the charge-balancing features, written before the critical features are written, purposely add equal electron charge above and below the critical images to prevent electron beam deflection by unequal electron charge that would otherwise exist.

While the invention has been shown or described in only some of its forms, it should be apparent to those skilled in the art that it is not so limited, but is susceptible to various changes without departing from the scope of the invention.

For example, the foregoing description is presented as but not limited to a standard MR process that uses ion beam milling through a photo-resist mask to define the on-wafer MR stripe layer. The wafer layers are processed with an undercoat, a first MR shield, a first MR gap, an MR stripe film, and any additional layer that might be required. These steps may use one or more technologies such as sputtering, ion beam deposition, chemical machining processes, or other technologies that might be developed by those skilled in the art of MR wafer processing.

What is claimed is:

1. A method of charge-balancing and continuously writing a wafer mask process, comprising:
   (a) providing a wafer with a plurality of rows;
   (b) writing a foreground field with charge-balancing features on the wafer, row-by-row, to build critical features for a plurality of magneto resistive (MR) devices on each row to define an MR stripe field;
   (c) writing additional critical features that define additional boundaries of the MR stripe field between the charge-balancing features; and
   (d) writing a background field having non-critical features adjacent to each of the critical features to form a charge-balanced, continuous write wafer mask.

2. The method of claim 1, wherein step (b) comprises writing the charge-balancing features as negative images.

3. The method of claim 1, wherein step (b) comprises writing a pair of charge-balancing features for each MR device, the pair being equal in size and equal in resist charge but spaced apart from each other.

4. The method of claim 3, wherein step (b) comprises placing the charge-balancing features in close proximity to an area where the MR stripe field is written.

5. The method of claim 1, wherein step (b) comprises using a center portion of a glass plate for the MR stripe field.

6. The method of claim 1, wherein step (c) comprises defining the additional critical features as upper and lower edges of the MR stripe field.

7. The method of claim 1, wherein step (c) comprises writing the additional critical features in a continuous write mode, pair-by-pair, unfractured, in-line along each row of, and equal distance from the MR devices, such that electromagnetic forces acting on a writing device that write the MR stripe field is equal and, thus, significantly reduces any deflection of the writing device by external motive charging.

8. The method of claim 1, wherein the writing steps comprise using an E-beam.

9. The method of claim 1, wherein step (d) comprises writing the non-critical features in a peripheral area of the background field as positive working images at a relatively larger spot size than the critical images in order to reduce write time.

10. The method of claim 1, wherein step (d) comprises ignoring fracturing and non-continuous writing.

11. The method of claim 1, further comprising overlaying and overlapping the background field with the foreground field.

12. The method of claim 1, further comprising exposing the foreground field before the background field.

13. The method of claim 1, further comprising exposing the foreground field using a same energy and time of exposure as the background field.

14. The method of claim 1, further comprising exposing the resist with the background field so that the charge-balancing features are not exposed into resist by the foreground field.

15. The method of claim 1, wherein each of the background and foreground fields are spaced apart from each other, and further comprising using fields that are angled to span the spaced apart background and foreground fields to reduce the formation of deviations.

16. The method of claim 15, further comprising adding the angles to the background field, and extending the foreground field above an apex of the background field.

17. A method of charge-balancing and continuously writing a wafer mask process, comprising:
   (a) providing a wafer with a plurality of rows;
   (b) writing a foreground field with charge-balancing features as negative images on the wafer, row-by-row, to build critical features for a plurality of magneto resistive (MR) devices on each row to define MR stripe fields;
   (c) writing additional critical features that define additional boundaries of the MR stripe fields between each of the charge-balancing features, and defining the additional critical features as upper and lower edges of the MR stripe fields; and
   (d) writing a background field having non-critical features adjacent to each of the critical features to form a charge-balanced, continuous write wafer mask.

18. The method of claim 17, wherein step (b) comprises writing a pair of charge-balancing features for each MR device, the pair being equal in size and equal in resist charge but spaced apart from each other, and placing the charge-balancing features in close proximity to an area where the MR stripe fields are written.

19. The method of claim 17, wherein step (c) comprises writing the additional critical features in a continuous write mode, pair-by-pair, unfractured, in-line along each row of, and equal distance from the MR devices, such that electromagnetic forces acting on a writing device that write the MR stripe fields is equal and, thus, significantly reduces any deflection of the writing device by external motive charging.

20. The method of claim 17, wherein step (d) comprises writing the non-critical features in a peripheral area of the background field as positive working images at a relatively larger spot size than the critical images in order to reduce write time.

21. The method of claim 17, wherein step (d) comprises ignoring fracturing and non-continuous writing.

22. The method of claim 17, further comprising overlaying and overlapping the background field with the foreground field.

23. The method of claim 17, further comprising exposing the foreground field before the background field, and exposing the foreground field using a same energy and time of exposure as the background field.

24. The method of claim 17, further comprising exposing the resist with the background field so that the charge-balancing features are not exposed into resist by the foreground field.

25. The method of claim 17, wherein each of the background and foreground fields are spaced apart from each other, and further comprising using fields that are angled to span the spaced apart background and foreground fields to reduce the formation of deviations, and adding the angled fields to the background field, and extending the foreground field above an apex of the background field.

* * * * *